(12) United States Patent
Chen et al.

(10) Patent No.: US 6,220,091 B1
(45) Date of Patent: *Apr. 24, 2001

(54) LIQUID LEVEL PRESSURE SENSOR AND METHOD

(75) Inventors: Fufa Chen, Cupertino; Yu Chang, San Jose; Gwo Tzu, Sunnyvale, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/976,961

(22) Filed: Nov. 24, 1997

(51) Int. Cl.$^7$ ..................................... G01F 23/18
(52) U.S. Cl. .............................. 73/302; 438/14; 438/541; 73/299
(58) Field of Search .................. 73/1.35, 19.05, 73/31.04, 861.47, 861.49, 299, 61.77, 302, 290 B, 298, 865.2, 861.42, 863.03; 438/14, 541

(56) References Cited

U.S. PATENT DOCUMENTS

| | | |
|---|---|---|
| 867,994 | 10/1907 | Murphy . |
| 2,658,389 | 11/1953 | Eby . |
| 3,431,636 | * 3/1969 | Granberry et al. .................. 438/541 |
| 3,729,997 | 5/1973 | Luke ...................... 73/202 |
| 3,791,157 | * 2/1974 | Tracy et al. ............... 62/630 |
| 3,987,815 | 10/1976 | Georgeson ............... 137/486 |
| 4,235,829 | 11/1980 | Partus ............... 261/121 R |
| 4,409,833 | 10/1983 | Thomson et al. ............ 346/302 |
| 4,639,738 | 1/1987 | Young et al. ............ 73/75 |
| 5,005,408 | 4/1991 | Glassey ................ 73/301 |
| 5,107,898 | * 4/1992 | Keeney ................. 137/871 |
| 5,130,459 | * 7/1992 | Shinzawa ............... 556/178 |
| 5,163,324 | 11/1992 | Stewart . |
| 5,309,764 | * 5/1994 | Waldrop et al. ............ 73/302 |
| 5,347,863 | 9/1994 | Richard ................. 73/301 |
| 5,406,828 | 4/1995 | Hunter et al. ............ 73/4 R |
| 5,423,226 | 6/1995 | Hunter et al. ............ 73/861.63 |
| 5,506,791 | 4/1996 | Hungerford et al. ......... 364/510 |
| 5,568,882 | 10/1996 | Takacs .................. 222/61 |
| 5,636,547 | 6/1997 | Raj et al. ............... 73/299 |
| 5,994,209 | * 11/1999 | Yieh et al. .............. 438/541 |

OTHER PUBLICATIONS

Advanced Process Technology, Inc. "*Model 2000 Liquid Level Sensor User's Guide*" Rev. A Sep. 1994.

Boldish, Steven I., "*Liquid Level Sensing of Semiconductor Liquids*" Advanced Process Technology, Inc.

* cited by examiner

Primary Examiner—Hezron Williams
Assistant Examiner—Michael Cygan
(74) Attorney, Agent, or Firm—Townsend and Townsend and Crew

(57) ABSTRACT

The present invention provides methods and systems for forming deposition films on semiconductor wafers. In particular, the present invention measures the amount of liquid remaining in a bubbler ampule of a semiconductor processing system used for chemical vapor deposition (CVD) on a semiconductor wafer. More particularly, measurements are made when gas has stopped flowing through the ampule, and the liquid is in a static condition. The system of the present invention comprises a container containing a liquid, a gas inlet for introduction of gas into the liquid, a gas outlet, and a pressure transducer fluidly connected to the gas inlet and the gas outlet. The device measures the amount of liquid in a bubbler ampule through measurements of gas pressure differential between gas exiting a nozzle near the bottom of the liquid and gas located above the level of the liquid. The depth of liquid remaining in the ampule may be extrapolated from the measured pressure differential.

20 Claims, 10 Drawing Sheets

LIQUID LEVEL PRESSURE SENSOR AND METHOD

BACKGROUND OF THE INVENTION

The present invention relates generally to semiconductor processing. Specifically, the present invention is directed to systems and methods for measuring the amount of liquid remaining in a bubbler ampule used for chemical vapor deposition (CVD) on a semiconductor wafer.

Prior to introduction into a CVD processing chamber, deposition material supplied to the processing chamber is typically in a liquid or gaseous state. In one method of introducing liquid material into a CVD processing chamber, a carrier gas is bubbled through an ampule containing the liquid, and the resulting gas mixture is directed towards the processing chamber. Through the course of wafer processing, the liquid chemicals in the ampule will eventually become depleted and require replacement.

In a typical semiconductor process, the total liquid chemical replacement process can take from two to eight hours, depending upon the chemical involved and the system configuration. A bubbler ampule with fresh chemicals is inserted in place of the depleted ampule which is returned to the chemical manufacturer who cleans and refills the depleted ampule for future use. Unfortunately, the entire CVD system is inoperable during this replacement time, and temperatures in the bubbler ampule and other portions of the CVD system are lowered during these periods of nonoperation. Prior to restarting the process, both the bubbler ampule and other parts of the CVD system usually must be reheated to their operating temperatures. Also, test samples are routinely run through the process to ensure that the replenished chemical is not contaminated prior to resuming the production operation.

It is desirable to coordinate the replacement of depleted ampules so as to minimize the effect on wafer production. However, it is difficult to ascertain when a bubbler ampule needs replacing. Often, the depletion of liquid in the ampule may occur at nonlinear rates, requiring frequent monitoring of liquid levels. With each wafer costing in the thousands of dollars, significant financial losses may result from ruining a batch of wafers when deposition material is depleted during processing or from losing production time while waiting for a replacement ampule to arrive.

Unfortunately, the desire to measure the liquid remaining in an ampule is hampered by the deficiencies of conventional liquid level sensors. As discussed below, the nature of chemicals used in processes such as aluminum (Al) CVD severely limits the usefulness of these known sensors. Organoaluminum compounds such as dimethylaluminum hydride (DMAH) used in Al-CVD processes are liquid at room temperature, corrosive to many metals, and violently explosive when exposed to ambient air or water. Details on DMAH and Al-CVD methods can be found in R. Bhat et al., J. Crystal Growth, vol. 77 pp. 77 (1986), the complete disclosure of which is incorporated herein by reference. These qualities of organoaluminums present a variety of challenges for liquid level sensors.

First, to reduce the risk of accidentally exposing these chemicals to ambient air or water due to rupture or impact, the bubbler ampules for these organoaluminum compounds are typically made of materials, such as stainless steel, which will stretch and deform prior to breaking. Unfortunately, ampules made of such resilient materials are almost always non-transparent and do not provide visual cues as to the amount of liquid it contains. Further, the concern over leakage prevents the installation of conventional glass or other clear viewports to monitor levels of liquid remaining within the ampule. For this reason, non-transparent ampules make it difficult to determine how much liquid remains in the ampules, and this uncertainty may lead to significant losses in manufacturing time and material.

Second, the operating environment within the bubbler ampule interferes with the accuracy and reliability of other conventional sensors. Most optical sensors are too fragile to withstand transport and cleaning of the ampule when it is returned the chemical vendor. Metallic float sensors which typically slide along a vertical rod inside the ampule are unreliable as they are subject to corrosion which leave deposits that prevent the float from moving with the liquid level. Metallic float sensors also increase the risk of contaminating the high purity deposition material as they may shed metal particles or ion into the ampule environment as they slide against other metal parts in the ampule.

To avoid these drawbacks, some known liquid level sensors such as Advanced Process Technology's Liquid Level 2000 use gas pressure differentials to measure the depth of liquid remaining in a bubble ampule. The liquid level 2000 sensor is designed, however, to provide meaningful measurements only when a carrier gas is flowing through the sensor. This presents a problem in that the viscosity and other properties of organoaluminum compounds such as DMAH adversely affect the reliability and accuracy of the system. Further details of the liquid level 2000 sensor are discussed below with respect to FIG. 4B.

Accordingly, improved methods and devices are needed for reliably monitoring liquid level within an opaque container. Preferably these improved methods and devices will monitor the liquid level without contaminating the environment within the container and also provide desired levels of safety and accuracy during measurements.

SUMMARY OF THE INVENTION

The present invention provides an improved device, system, and method for measuring liquid level in an enclosed, opaque container through the measurement of gas pressures within the container. In particular, the invention measures gas pressures at the top and bottom of the liquid to extrapolate the depth of the liquid in the container. Advantageously, this allows the liquid level to be measured without introducing moving parts into the liquid where the parts may become corroded or damaged due to repeated exposure to the liquid and does not compromise the safety of those working near the container. Further, the present invention allows liquid level measurements to be made when the liquid is at generally static conditions.

In one aspect of the invention, a method for determining the level of a liquid in a container comprises the step of flowing a process gas through a gas inlet of the container into a liquid within the container. The process gas may be a carrier gas or a deposition material gas. The process gas is allowed to pass through a gas outlet of the container into a semiconductor processing chamber typically having a pressure lower than that of the container. The flow of the process gas is stopped to measure gas pressure differentials in the container. The process determines the volume of liquid within the container by measuring the pressure differential between the gas inlet and the gas outlet of the container when the process gas has stopped flowing. After measurements have been taken, the process may resume the flow of the process gas into the container.

In a specific embodiment, the container has an inlet valve upstream of the gas inlet and an outlet valve downstream of the gas outlet. The inlet valve is closed so as to allow gas to be drawn away from the container due to the vacuum in the processing chamber, ensuring that liquid does not enter the gas inlet. The closing of the outlet valve occurs after the inlet valve is closed. When the process gas is reintroduced into the bubbler ampule, the outlet valve is opened prior to the inlet valve. This sequencing of valve opening and closure advantageously allows the bubbler to measure pressure at static conditions while ensuring that liquid material will not be splashed into the bubbler ampule or that liquid will not backflow towards the gas inlet.

Measuring gas pressure when the carrier gas has stopped flowing provides several advantages. First, it is easier and more accurate to measure liquid level when the liquid is not being disturbed. Second, by measuring liquid when the carrier gas flow has stopped, the measurement device becomes system independent and the piping upstream from the bubbler ampule becomes irrelevant. Third, no software conversion tables or calibration curves are required to establish the liquid level of the ampule. The curves of measured and calculated pressures are linear and parallel with each other. Fourth, the method removes errors resulting from different carrier gas flow rates and different types of carrier gas. The system is independent of the flow rate and only one system constant (specific gravity of the liquid material) is needed to convert pressure readings into liquid level measurements. Fifth, the pressure transducer may further act as a leak detector as the loss of gas from the ampule will be detected during the static pressure measurement.

In one embodiment of the device of the present invention, an ampule delivery system for delivering gas to a semiconductor processing chamber comprises a container housing a liquid having a volume within the container, a gas inlet, and a gas outlet. A pressure measuring device is fluidly coupled to the gas inlet and the gas outlet for measuring a pressure differential between the gas inlet and the gas outlet when gas has stopped flowing from the gas inlet.

In a specific aspect of the invention, the pressure measuring device is capable of withstanding a sudden pressure increase or spike from about 1 Torr to 2070 Torr when gas is reintroduced into the chamber. Such a device typically comprises a diaphragm to detect pressure changes and a displacement delimiter located a distance from the diaphragm to prevent overextension of the diaphragm, thus allowing the pressure measuring device to withstand a sudden pressure increase or spike when gas is reintroduced into the chamber. The measuring device may further measure small pressure changes less than about 10 Torr.

In a preferred embodiment of the device of the present invention, the ampule delivery system further comprises an inlet valve attached to the gas inlet and an outlet valve attached to the gas outlet. In such an embodiment, the system typically also comprises a first connecting tube linking the pressure measuring device to the gas inlet downstream of the inlet valve and a second connecting tube linking the pressure measuring device to the gas outlet upstream of the outlet valve. In this manner, the pressure differential measuring device remains fluidly connected to the gas inlet, gas outlet, and the container when the valves are in a closed condition.

In an alternate embodiment of the device of the present invention, the pressure measuring device has a first valve and a second valve on the connecting tubes for fluidly separating the measuring device from the gas inlet and gas outlet when the first and second valves are in a closed condition. By closing these valves, the measuring device avoids exposure to sudden gas pressure spikes when gas is reintroduced into the bubbler ampule.

For a further understanding of the nature and advantages of the present invention, reference should be had to the ensuing specification and attached drawings.

DETAILED DESCRIPTION OF THE SPECIFIC EMBODIMENTS

I. Overview of a Representative CVD Apparatus

The present invention is directed to semiconductor processing. In particular, the present invention is directed to systems, devices, and methods for use in semiconductor manufacturing equipment to measure the amount of liquid material remaining in a bubbler ampule connected to a chemical vapor deposition (CVD) processing chamber.

Figure 1:
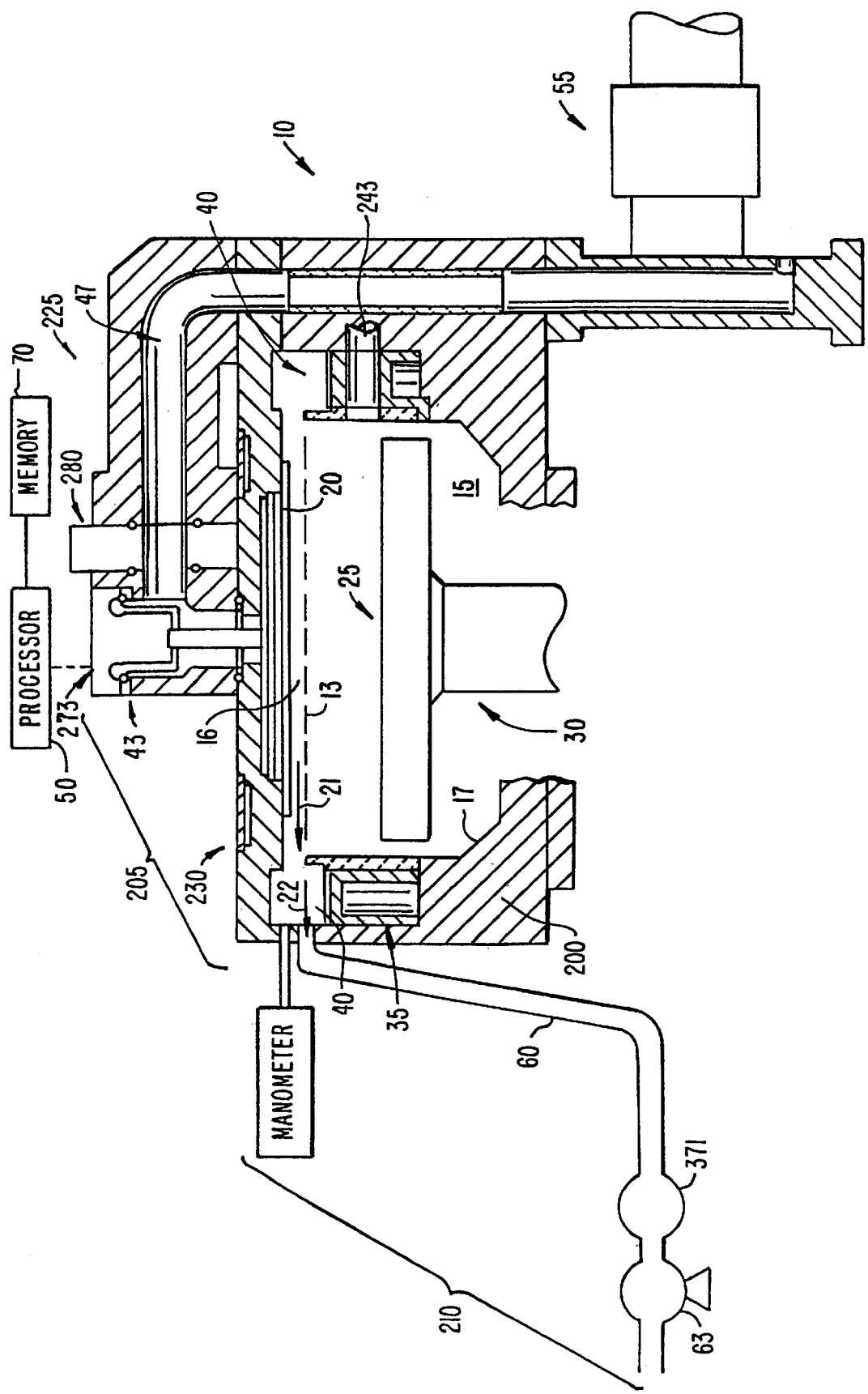
FIG. 1 is a vertical, cross-sectional view of a representative CVD apparatus compatible with a bubbler ampule.

Referring to the drawings in detail, a representative CVD system using the device of the present invention is described. FIG. 1 is a vertical, cross-sectional view of a representative CVD apparatus 10 according to the present invention. The CVD apparatus 10 generally includes an enclosure assembly 200 having a vertically movable heater (wafer support pedestal or susceptor) 25 for supporting a semiconductor wafer within a chamber 15. Process gas or gases are delivered into chamber 15 to perform various deposition and etching steps on the wafer. A gas distribution system 205 distributes process gases from gas sources 90 (FIG. 2) onto the wafer, and an exhaust system 210 discharges the process gases and other residue from chamber 15. CVD apparatus 10 further includes a heater/lift assembly 30 that includes heater 25 for heating the wafer and for lifting the wafer upwards into a processing position within chamber 15. An integral remote microwave plasma system 55 may also be provided in CVD apparatus 10 for periodic chamber cleaning, wafer cleaning, or depositing steps. In some embodiments, a microwave power supply 110 provides power to the magnetron in remote plasma system 55.

Figure 2:
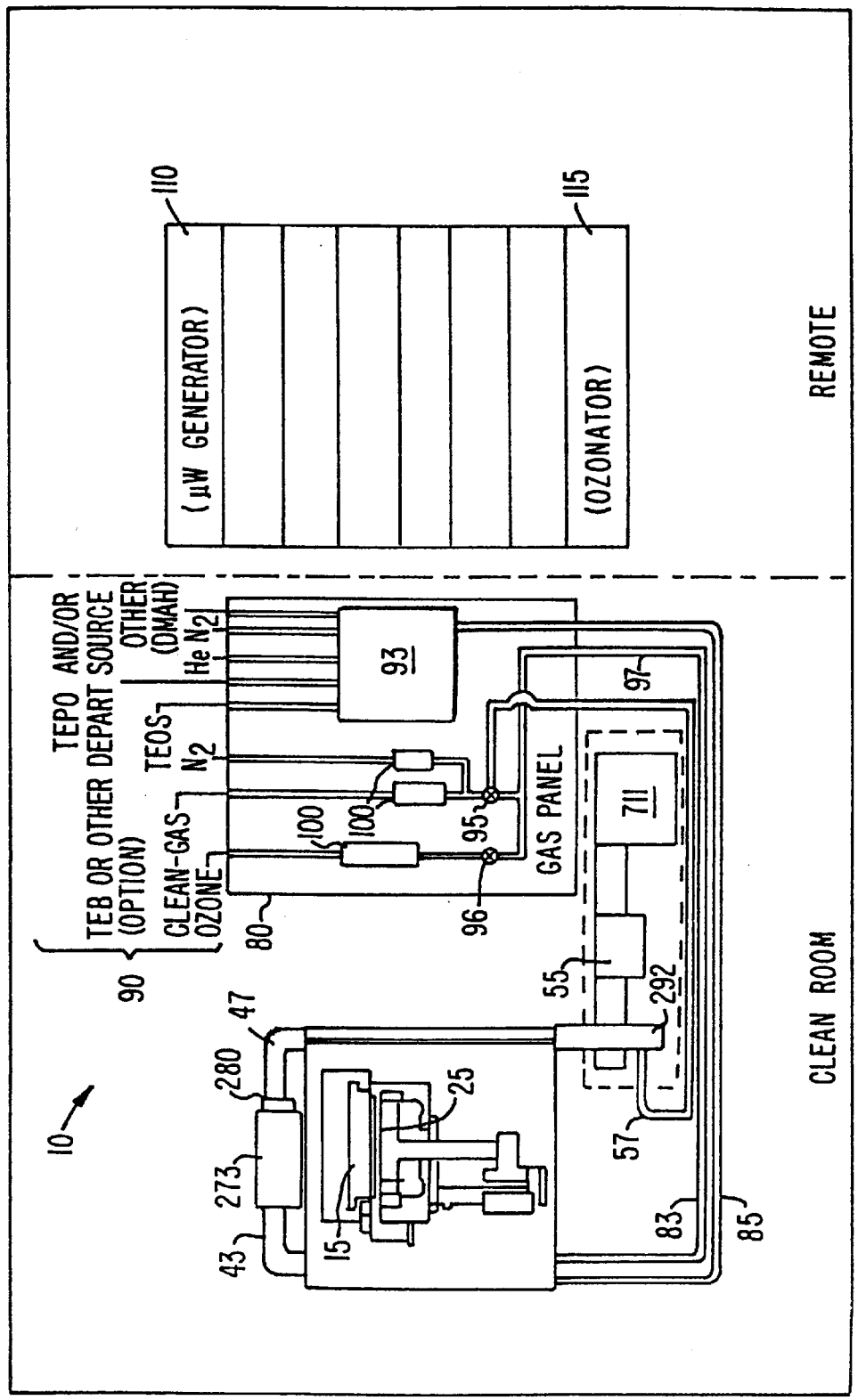
FIG. 2 illustrates a general overview of the CVD apparatus in relation to a gas supply panel located in a clean room.

As shown in FIG. 1, CVD apparatus 10 includes an enclosure assembly 200 housing a vacuum chamber 15 with a gas reaction area 16. A gas distribution plate 20 is provided above the gas reaction area 16 for dispersing reactive gases through perforated holes in plate 20 to a wafer (not shown) that rests on a vertically movable heater 25 (also referred to as a wafer support pedestal or susceptor). CVD apparatus 10 further includes a heater/lift assembly 30 for heating the wafer supported on heater 25. Heater/lift assembly 30 also can be controllably moved between a lower loading/off-loading position and an upper processing position indicated by dotted line 13 which is closely adjacent to plate 20, as shown in FIG. 1. A center board (not shown) includes sensors for providing information on the position of the wafer. The heater 25 includes resistively-heated components for bring the wafer to processing temperature. When heater 25 and the wafer are in processing position 13, they are surrounded by a chamber liner 35 along the inside walls 17 of apparatus 10 and by an annular pumping channel 40, formed by chamber liner 35 and a top portion of chamber 15. Although the chamber 15 may operate under a variety of different pressures, preferably the chamber is at a subatmospheric pressure during wafer processing. Specifically, the pressure in the chamber 15 should be lower than the pressure in ampule 400 (FIG. 2).

The surface of chamber liner 35 preferably comprises a ceramic material, such as alumina or aluminum nitride, which serves to lower the temperature gradient between resistively-heated heater 25 (high temperature) and chamber walls 17, which are at a much lower temperature relative to heater 25. Chamber liner 35 serves to inhibit process gases from flowing to the back side of the wafer. In addition, since heater 25 has a smaller diameter than enclosure assembly 200, liner 35 inhibits the flow of process gases below heater 25 to the lower portion of chamber 15. Accordingly, undesired deposition onto the bottom of heater 25 and the lower portion of chamber 15 is minimized. Further, liner 35 provides thermal insulation between the aluminum walls of enclosure assembly 200 and the edge of the wafer on heater 25, in order to prevent wafer edge cooling during high temperature processing. Without liner 35, the heat effects at the edge of the wafer may adversely affect temperature uniformity across the wafer and lead to non-uniform deposition. For further details of a suitable CVD apparatus for use with the present invention, reference commonly assigned, co-pending U.S. patent application Ser. No. 08/748,883, filed Nov. 13, 1996 (Attorney Docket No. 16301-015900), the complete disclosure of which is incorporated herein by reference.

Enclosure assembly 200 includes an outer lid assembly 225 for delivering process and clean gases through an inlet tube 43 to an inner lid assembly 230 within assembly 200. Inner lid assembly 230 fictions to disperse the gases throughout chamber 15 onto a wafer (not shown) supported on heater 25. Reactive and carrier gases are supplied through supply line 43 into a gas mixing box (or gas mixing block) 273, where they are preferably mixed together and delivered to plate 20. Gas mixing box 273 is preferably a dual input mixing block coupled to a process gas supply line 43 and to a cleaning gas conduit 47. A processor 50 preferably controllably operates a gate valve 280 to choose which of these two alternate sources of gases are sent to plate 20 for dispersing into chamber 15. Conduit 47 receives gases from an integral remote microwave plasma system 55, which has an inlet 57 for receiving input gases.

During deposition processing, gas supplied to plate 20 is vented toward the wafer surface (as indicated by arrows 21), where it may be uniformly distributed radially across the wafer surface, typically in a laminar flow. Purging gas may be delivered into chamber 15 from an inlet port or tube (not shown) through the bottom wall of enclosure assembly 200. The purging gas flows upward past heater 25 and to an annular pumping channel 40. An exhaust system then exhausts the gas (as indicated by arrows 22) into the annular pumping channel 40 and through an exhaust line 60 by a vacuum pump in exhaust system 210. Exhaust gases and residues are preferably released from annular pumping channel 40 through exhaust line 60 at a rate controlled by a throttle valve system 63. Isolation valve 371 may be used to isolate process chamber 15 from the vacuum pump to minimize the reduction of chamber pressure due to the pumping action of the pump. A more complete description of exemplary designs for gas distribution systems can be found in commonly assigned, co-pending U.S. patent application Ser. No. 08/631,902, filed Apr. 16, 1996 (Attorney Docket No. 1034), the complete disclosure of which is incorporated herein by reference, and in commonly assigned U.S. Pat. No. 4,872,947 to Wang, the complete disclosure of which is also incorporated herein by reference.

Motors and optical sensors (not shown) are used to move and determine the position of movable mechanical assemblies such as throttle valve system 63 and heater 25. The heater/lift assembly 30, motors, gate valve 280, throttle valve system 63, remote microwave plasma system 55, and other system components are controlled by processor 50 over control lines 65, of which only some are shown. The chamber 15 has a vacuum lock door (not shown) and a slit valve opening 243 through which a wafer loading assembly (not shown) transports a wafer W into process chamber 15 and loads wafer W onto heater 25. The wafer loading assembly is preferably a conventional robotic mechanism disposed within a transfer chamber (not shown) of the multichamber processing system. A suitable robotic transfer assembly is described in commonly assigned U.S. Pat. No. 4,951,601 to Maydan, the complete disclosure of which is incorporated herein by reference.

FIG. 2 illustrates a general overview of CVD apparatus 10 in relation to a gas supply panel 80 located in a clean room. CVD apparatus 10 includes chamber 15 with heater 25, gas mixing box 273 with inputs from supply line 43 and conduit 47, and remote microwave plasma system 55 with input line 57. As mentioned above, gas mixing box 273 is for mixing and injecting deposition gas(es) and clean gas(es) or other gas(es) through inlet tube 43 to the processing chamber 15. As seen in FIG. 2, remote microwave plasma system 55 is integrally located and mounted below chamber 15 with conduit 47 extending alongside chamber 15 to gate valve 280 and gas mixing box 273, located above chamber 15. 5. Specific details of a suitable plasma system for use with the present invention can be found in commonly assigned, co-pending application Ser. No. 08/747,830, filed Nov. 13, 1996 (Attorney Docket No. 16301-017100), the complete disclosure of which is incorporated herein by reference. Similarly, gas supply line 43, which extends alongside chamber 15 to gas mixing box 273, is provided with reactive gases via lines 83 and 85 from gas supply panel 80. Gas supply panel 80 includes lines to gas or liquid supply sources 90, containing gases or liquids that may vary depending on the desired processes used for a particular application. Gas supply panel 80 has a mixing system or bubbler ampule 400 which receives the deposition process and carrier gases from sources 90 for mixing and sending to gas mixing box 273 via line 85 to supply line 43.

Generally, supply lines for each of the process gases include (i) shut-off valves 95 that can be used to automatically or manually shut off the flow of process gas into line 85 or line 57, and (ii) mass flow controllers 100 that measure the flow of gas or liquid through the supply lines. When toxic gases (for example, ozone and the clean gas) are used in the process, the several shut-off valves 95 may be positioned on each gas supply line in conventional configurations. The rate at which the deposition and carrier gases including, for example, dimethylaluminum hydride (DMAH), tetraethylorthosilane (TEOS), helium (He), and nitrogen ($N_2$), and optionally triethylphosphate (TEPO), triethylborate (TEB), and/or other dopant sources, are supplied to bubbler ampule 400 is also controlled by liquid or gas mass flow controllers (MFCs) (not shown) and/or by valves (not shown). The DMAH, TEPO, and TEOS sources are all liquid sources that also may be vaporized by conventional boiler-type or bubbler-type hot boxes in other embodiments. A carrier gas, such as helium or hydrogen, is passed through or mixed with the liquid material before being delivered to heated line 85. Of course, it is recognized that other sources of dopants, silicon, and oxygen also may be used.

Processor 50 shown in FIG. 1 controls all of the activities of the CVD machine. Acting as the system controller, processor 50 executes system control software, which is a computer program stored in a memory 70 coupled to processor 50. Preferably, memory 70 may be a hard disk drive, but of course memory 70 may be other kinds of memory. In addition to a hard disk drive (e.g., memory 70), CVD apparatus 10 in a preferred embodiment includes a floppy disk drive and a card rack. Processor 50 operates under the control of the system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or other computer program product inserted in a disk drive or other appropriate drive, may also be used to operate processor 50. The card rack contains a single-board computer, analog and digital input/output boards, interface boards and stepper motor controller boards. Various parts of CVD apparatus 10 conform to the Versa Modular European (VME) standard which defines board, card cage, and connector dimensions and types. The VME standard also defines the bus structure having a 16-bit data bus and 24-bit address bus.

The processes for depositing the film, performing a clean, and performing reflow or drive-in steps can be implemented using a computer program product that is executed by processor 50. The computer program code can be written in any conventional computer readable programming language such as, for example, 68000 assembly language, C, C++, Pascal, Fortran, or other language. Suitable program code is entered into a single file, or multiple files, using a conventional text editor and is stored or embodied in a computer-usable medium, such as a memory system of the computer. If the entered code text is in a high-level language, the code is compiled, and the resultant compiler code is then linked with an object code of precompiled Windows library routines. To execute the linked compiled object code, the system user invokes the object code, causing the computer system to load the code in memory, from which the CPU reads and executes the code to perform the tasks identified in the program. Details on the control algorithms used with processing chamber can be found in commonly assigned, co-pending application Ser. No. 08/748,883, filed Nov. 13, 1996 (Attorney Docket No. 16301-015900), the complete disclosure of which was previously incorporated by reference.

The CVD system description presented above is mainly for general illustrative purposes and should not be considered as limiting the scope of the present invention. The exemplary CVD system 10 is a single-wafer vacuum chamber system. However, other CVD systems that are multiple-wafer chamber systems may be used in other embodiments of the invention. It should be understood, however, that although certain features of the invention are shown and described as part of a CVD chamber in a multichamber processing system, the invention is not necessarily intended to be limited in this manner. That is, the invention can be used in a variety of processing chambers, such as etch chambers, diffusion chambers or the like. Variations of the above described system such as variations in design, heater design, location of RF power connections, software operation and structure, specific algorithms used in some software subroutines, configuration of gas inlet lines and valves, and other modifications are possible.

II. Bubbler Ampule

As disclosed earlier, organoaluminum compounds enabling selective chemical vapor deposition (CVD) of aluminum (Al) are liquid at room temperature. In one method of introducing this kind of liquid material into a CVD reaction chamber, a carrier gas is bubbled through the liquid material and the resulting gas mixture is directed into the CVD reaction chamber. An Al-CVD process which uses, for instance, DMAH, uses $H_2$ gas as the carrier gas. Typically, the subatmospheric pressure in the CVD chamber draws the resulting gas mixture towards the CVD chamber.

Figure 3:
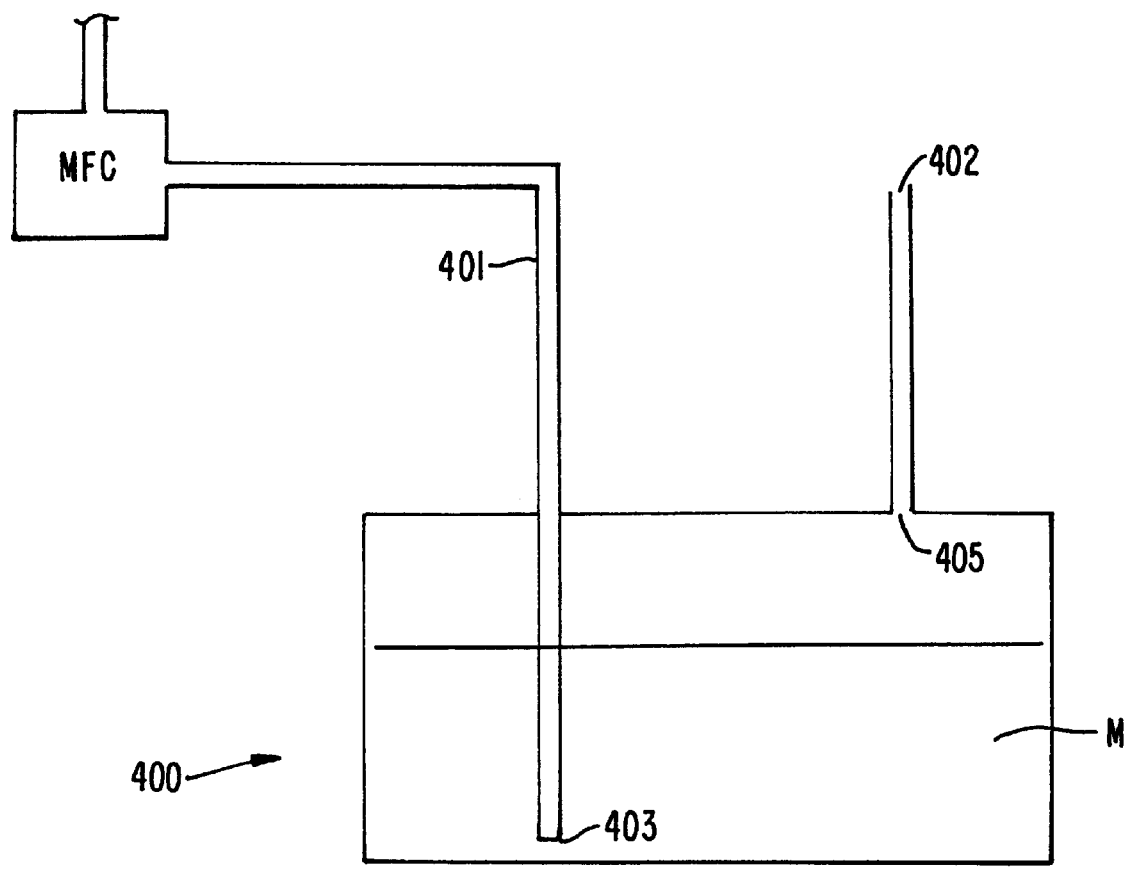
FIG. 3 shows a cross-section of a bubbler ampule with a pressure transducer and associated upstream and downstream carrier gas plumbing.

FIG. 3 is a schematic view of a representative bubbler ampule 400 used as a vaporizing device for liquid material gases. The bubbler ampule 400 is typically located upstream from the CVD chamber so as to supply the deposition gas mixture into the wafer substrate being processed in the chamber. In the bubbler ampule 400 shown in FIG. 3, a carrier gas is introduced into a liquid material M accommodated in bubbler ampule 400 from a carrier gas introducing or inlet pipe 401. The wall of the bubbler ampule 400 is preferably made of a nonreactive, nonbrittle material such as stainless steel or some equivalent compound.

Initially, the liquid material M is held in bubbler ampule 400 prior to introduction into the CVD reaction chamber. The carrier gas supplied through the gas introducing pipe 401 exits the pipe at a nozzle 403 immersed in the liquid material M inside the ampule 400 at a constant rate under the control of an ampule mass-flow controller (MFC). The nozzle 403 may be within about 0.3 to 0.5 cm from the bottom of the ampule 400. Bubbles are formed as gas enters the liquid in the ampule 400. As the preferred liquid material M is an organoaluminum compound which is usually viscous, the size of the bubbles depends on the carrier gas flow rate. These bubbles rise through the liquid material M, stimulating the liquid to vaporize and mix with the carrier gas. As the liquid material M is typically already somewhat volatile, bubbling disturbs the liquid and creates additional surface area to facilitate vaporization. Increasing the temperature of the liquid also increases vaporization rates. The mixture of vaporized liquid material and carrier gas exits through orifice 405 of the outlet pipe 402 towards the CVD chamber. In the chamber, the mixture is thermally decomposed on the heated semiconductor substrate, and aluminum is deposited on the substrate as a result of its surface reaction with the substrates.

III. Liquid Level Pressure Sensor

The properties of the liquid source material such as organoaluminum compounds has affected the design of liquid level sensors for the bubbler ampule. Most types of conventional liquid level sensors fail to provide the reliability and safety needed for such liquid source materials. For example, dimethylaluminum hydroxide (($CH_3$)$_2$AlH) is a highly viscous chemical that oxidizes in a potentially explosive manner when exposed to oxygen or water. This danger has made it impractical to employ visual methods to monitor fluid levels, such as a window or viewport in the ampule, for fear of cracking or breakage. The chemicals are also corrosive to metals, often forming byproducts which may adhere to the surfaces inside the ampule. This has reduced the reliability of float sensors and optical sensors which use more invasive methods to monitor the liquid level. These invasive methods are subject to calibration drift and damage as a result of deposits formed on the sensors due to chemical corrosion. These known methods also raise concerns over contamination of the ultra-high purity liquid material in the ampule from corrosion byproducts. Hence it has become desirable to create less invasive devices for measuring liquid levels in a closed, opaque container. Of particular interest are systems measuring liquid level based on pressure differentials in an ampule at static conditions.

Figure 4A:
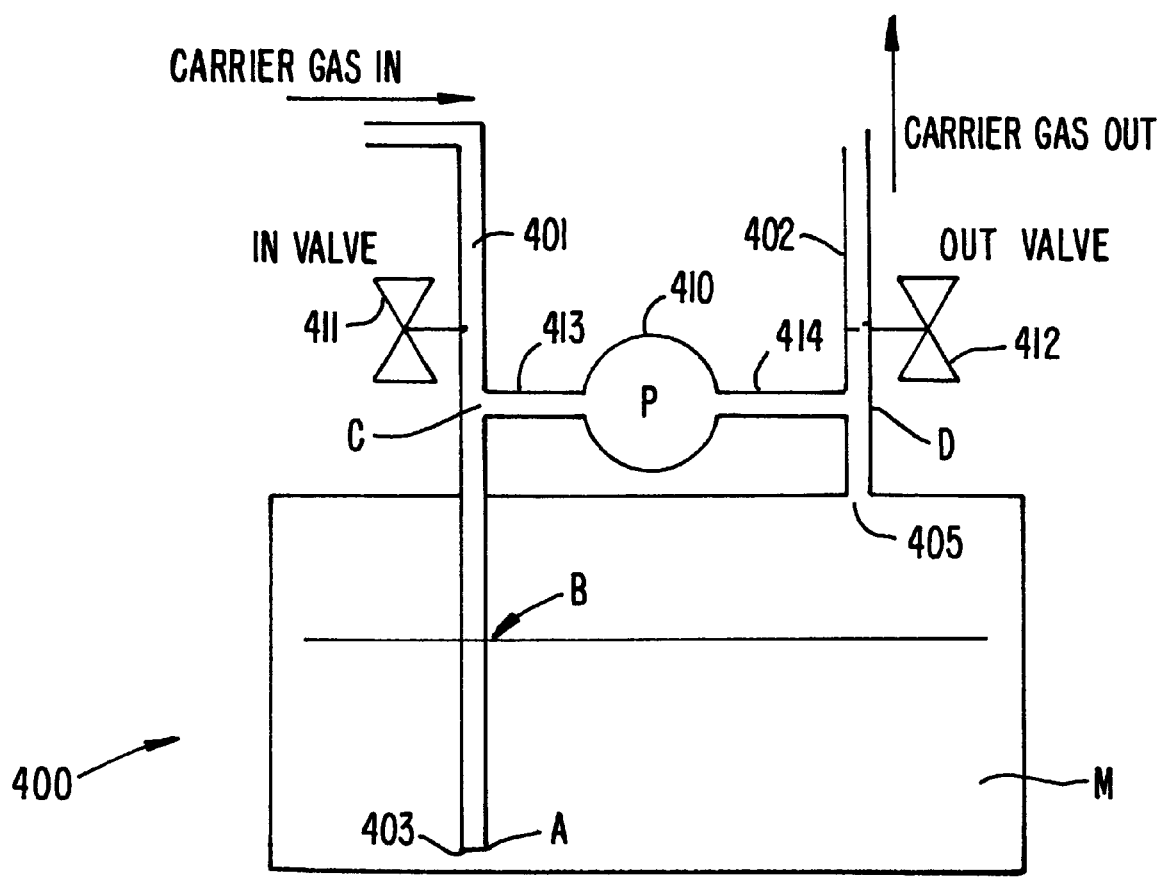
FIG. 4A depicts a cross-section of the bubbler ampule with notation to facilitate the explanation of liquid level measurements.

Referring to FIG. 4A, the liquid level pressure sensor according to the present invention will now be described. In one embodiment, the pressure sensor comprises a gas-burst resistant pressure transducer 410 (discussed below), an inlet valve 411 on inlet pipe 401, and an outlet valve 412 on outlet pipe 402. A connecting pipe 413 connects the pressure transducer 410 to inlet pipe 401 at a point downstream from inlet valve 411. Connecting pipe 414 links the pressure transducer 410 to the outlet pipe 402 at a point upstream from outlet valve 412. This location of the pressure transducer 410 allows the pressure transducer 410 to remain in gas contact with the ampule 400 even when valves 411 and 412 are in a closed condition. This continuous gas contact allows the pressure sensor to measure the liquid level when carrier gas is not flowing and the system is static.

The general theory behind the present pressure-based, liquid level sensor centers on determining the gas pressure at the top and the bottom of the liquid being measured. From this pressure differential, the height of liquid between the top and bottom can be extrapolated. Specifically, the gas pressure differential $P_{liquid}$ between a position A submerged in the liquid and a position B on the liquid surface is caused by the liquid level only. The specific gravity of the liquid is then used to relate this pressure differential $P_{liquid}$ to the height of the liquid. For example, the specific gravity of DMAH is 0.752 ($H_2O=1$). It can be calculated that 1 cm height of DMAH will cause a 0.51 Torr pressure difference. Hence, $P_{liquid}$ is divided by 0.51 Torr/cm to arrive at the height of the fluid in centimeters.

Referring to FIG. 4A and the following arithmetic calculations, it will be shown that the pressure sensor of the present invention which measures pressure at points C and D upstream and downstream from the ampule, is equivalent to measuring pressure at points A and B. In this manner, the present pressure sensor may be configured to be outside of the bubbler ampule 400, without any moving parts in the liquid M of the bubbler ampule. The pressure at position C near the inlet valve 411 can be expressed as $P_C=P_{liquid}+P_B+P_{surface}$, which is the sum of pressure caused by the liquid between positions A and B ($P_{liquid}$), gas pressure at position B ($P_B$), and pressure from surface tension of the liquid M at B ($P_{surface}$). The surface tension is negligible and can be ignored. Furthermore, $P_D$ equals $P_B$ since the positions B and D are in gas contact. Hence the pressure of the liquid is the difference between the pressure at C and the pressure at D or $P_{liquid}=P_C-P_D$. In a preferred embodiment of the invention, the pressure transducer 410 measures $P_{liquid}$ or the pressure differential between points C and D. By knowing the pressure difference caused by the liquid between B and A (i.e. $P_{liquid}$) the liquid level between positions A and B can be extrapolated by dividing $P_{liquid}$ by the liquid's specific gravity (Torr/cm).

Figure 4B:
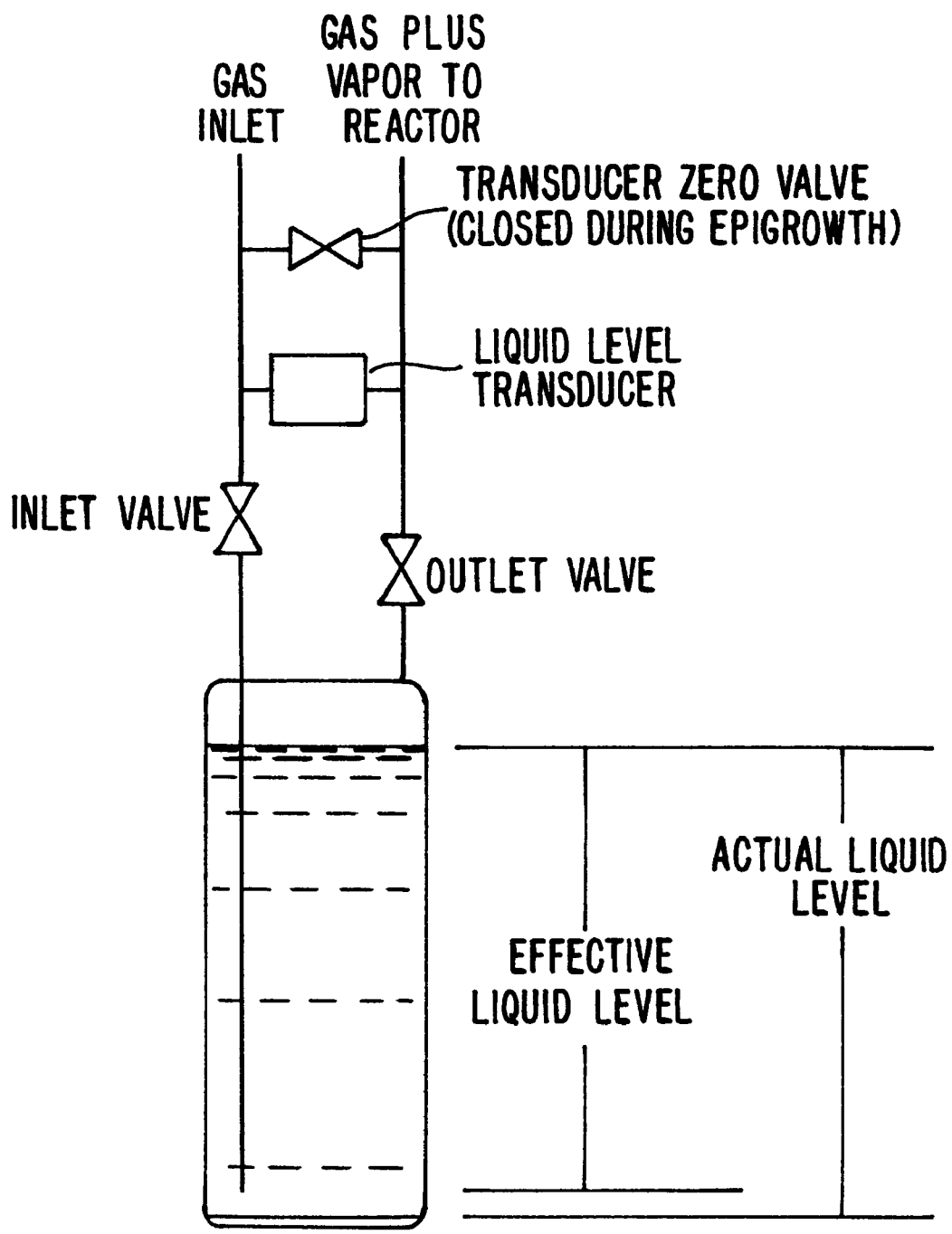
FIG. 4B shows an ampule and pressure sensor configuration for a known device in the art.

As mentioned above, the present pressure sensor measures liquid level when the ampule is in a static condition. Particular difficulties exist with measuring pressure at static conditions while the process is between wafer processing steps. First, the position of the pressure transducer must be relocated so that the transducer remains in fluid contact with the ampule when gas inlet and gas outlet valves leading to the ampule are in a closed condition. Otherwise, the transducer would be unable to measure the pressure when the valves close to move the ampule to a static condition. Most known art devices, however, isolate the transducer from the ampule when carrier gas is not flowing to reduce exposure of the device to deposition gas. As shown in FIG. 4B, known art devices locate the transducer above the valves and isolate the transducers from the ampule when the valves are closed. Second, carrier gas pressure builds up upstream from the ampule and when deposition gas is reintroduced into the ampule, a sudden spike in gas pressure results. Because of the new transducer location, the pressure transducer should be able to withstand the pressure spike. Third, special procedures should be taken to inhibit liquid from backflowing into a gas inlet pipe submerged in the liquid. Such backflow would skew the accuracy of the liquid level measurement.

Figure 5:
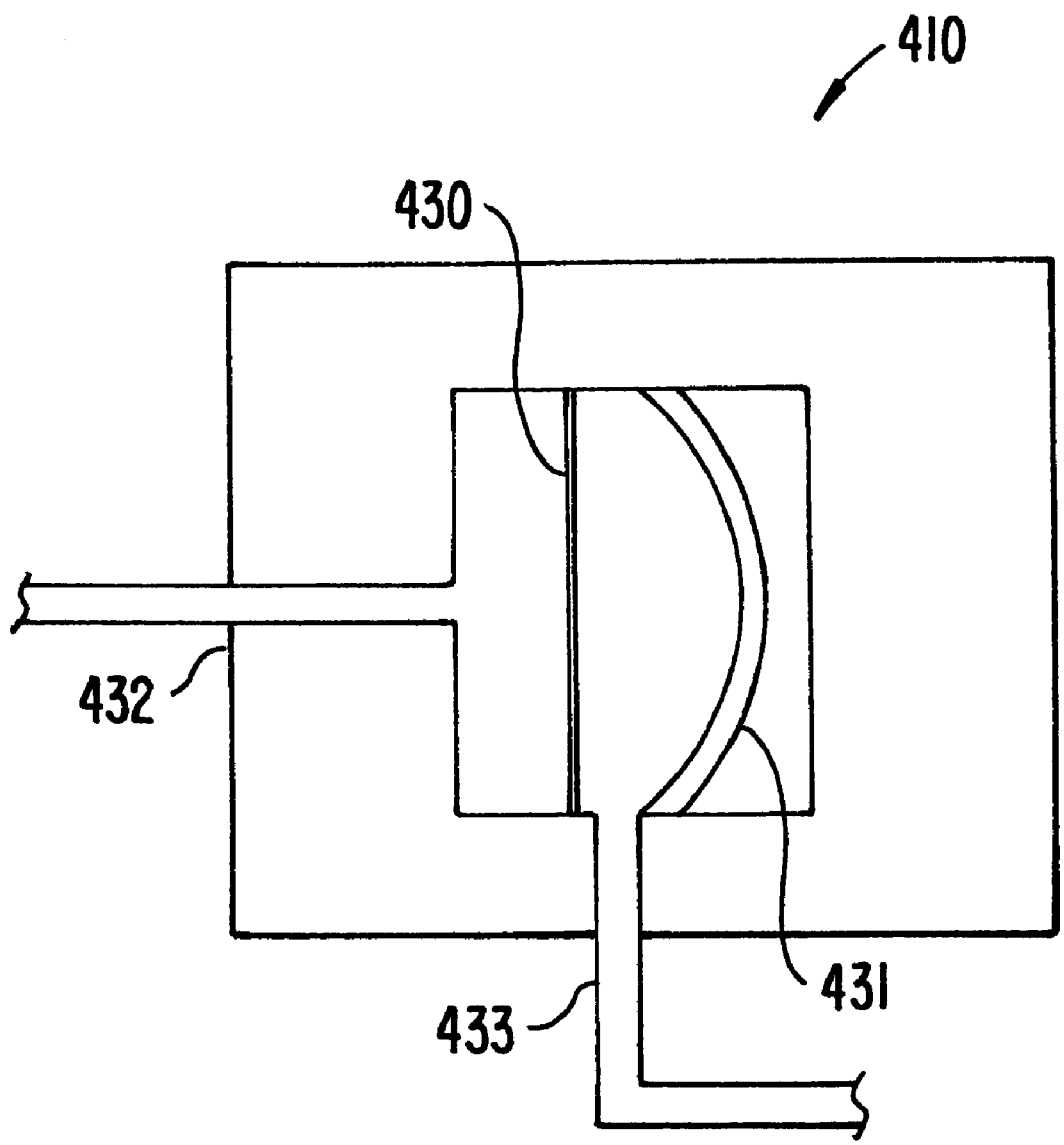
FIG. 5 shows a cross-section of an embodiment of a gas-burst resistant pressure transducer.

As shown in FIG. 4A and 5, the pressure sensor of the present invention has been designed to overcome the difficulties of measuring pressure when the ampule is in a static condition. The pressure transducer 410 of the present invention remains in fluid contact with the ampule 400 even after the valves 411 and 412 are closed. This transducer 410 location allows the present invention to measure pressure when carrier gas is not flowing and the ampule 400 is in a static condition. When the valves are closed, the transducer 410 will preferably be measuring the differential between the pressure at point C ($P_C$) and the pressure at point D ($P_D$). As shown in FIG. 5, preferred embodiments of the transducer 410 do not measure actual pressure, but measure the differential between two pressure inputs. Since $P_{liquid}=P_C-P_D$ and we desire to measure $P_{liquid}$, which is the pressure caused by the liquid between positions A and B, the transducer 410 provides us with the desired pressure information for calculating the height of liquid in the ampule 400.

Referring to FIGS. 4A and 5, the pressure sensor further preferably comprises a gas-burst resistant pressure transducer 410 for measuring the pressure when the carrier gas is off and the system is static. Inlet valve 411 and outlet valve 412 are used to regulate the flow of carrier gas entering and material gas mixture exiting the bubbler ampule 400. The pressure transducer should withstand a severe pressure spike once the valves 411 and 412 are opened to resume carrier gas flow. The transducer 410 preferably can withstand pressure spikes of about 2070 Torr while capable of measuring pressure of less than about 30 Torr, preferably less than about 10 Torr. The accuracy of the device may be between about ±0.10 Torr, preferably ±0.05 Torr, or more preferably ±0.01 Torr.

In a particular embodiment, as shown in FIG. 5, the pressure transducer 410 uses a diaphragm 430 to measure the pressure or pressure differential of gas sources connected to the transducer. A physical delimiter 431, such as a plate or a curved surface located a set distance from the diaphragm, limits diaphragm deflection, thus preventing breakage when the diaphragm is exposed to high pressure. First and second transducer connectors 432 and 433 allow the transducer to be connected to locations where pressure differentials are to be measured. Pressure transducers of the known art are located upstream from the inlet valve, are isolated from the ampule when the valves are closed, and hence cannot measure pressure differential at stoppage nor do they need to withstand the pressure spike when the valves are opened.

Figure 6:
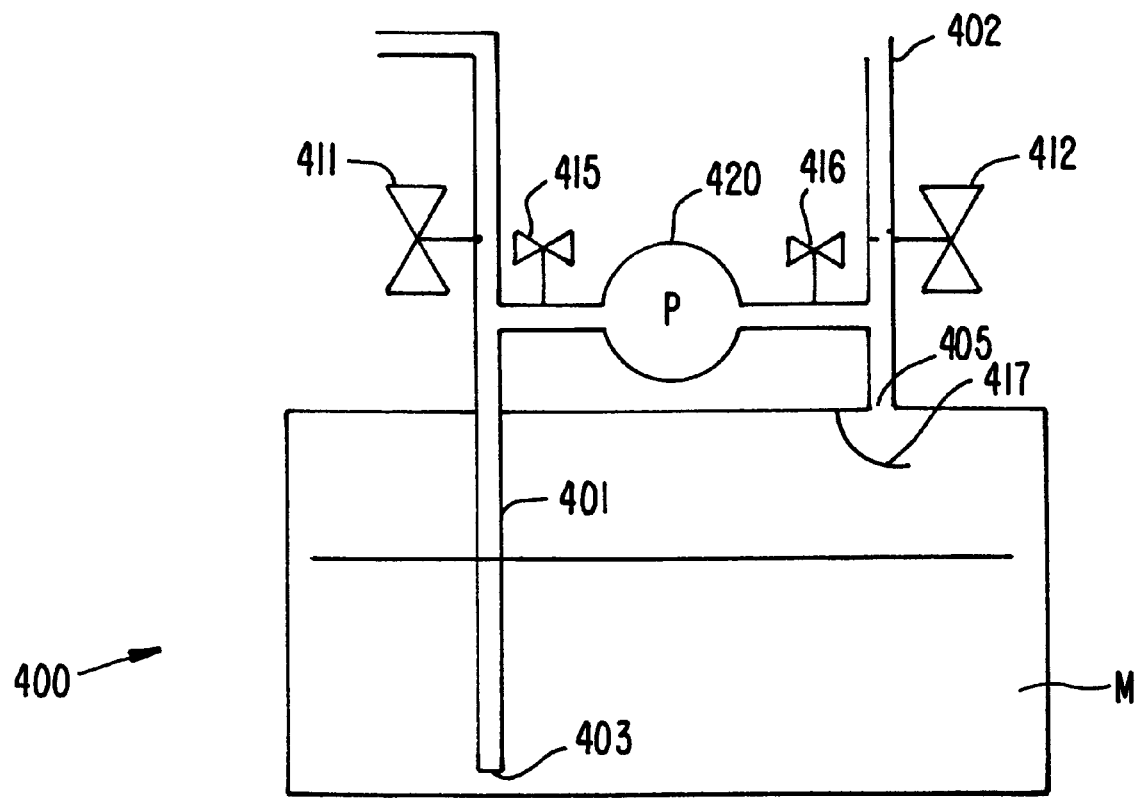
FIG. 6 illustrates an alternative embodiment of the bubbler ampule.

Referring to FIG. 6, an alternative embodiment of the present invention uses a pressure transducer 420 with isolation valves 415 and 416 which can be closed to shield the standard pressure transducer when the sudden pressure spike occurs when valves 411 and 412 are opened. The pressure transducer 420 may be of the same design as gas-burst resistant transducer or it may be a transducer of conventional design. FIG. 6 also shows a splash guard device 417 for preventing any liquid material from being sucked into the gas outlet as a result of a gas pressure spike when valve 411 is opened. The splash guard device 417 may be a dome-like structure or any other design so long as it prevents a splash of fluid from the ampule from exiting the gas outlet. In further aspects of the invention, the pressure transducer 420 may be heated to a temperature above that of the ampule 400 to prevent deposition of the liquid material in the pressure transducer. Maintaining the transducer 420 at a higher temperature may prevent vapor condensation on the pressure transducer's internal parts.

Figure 7:
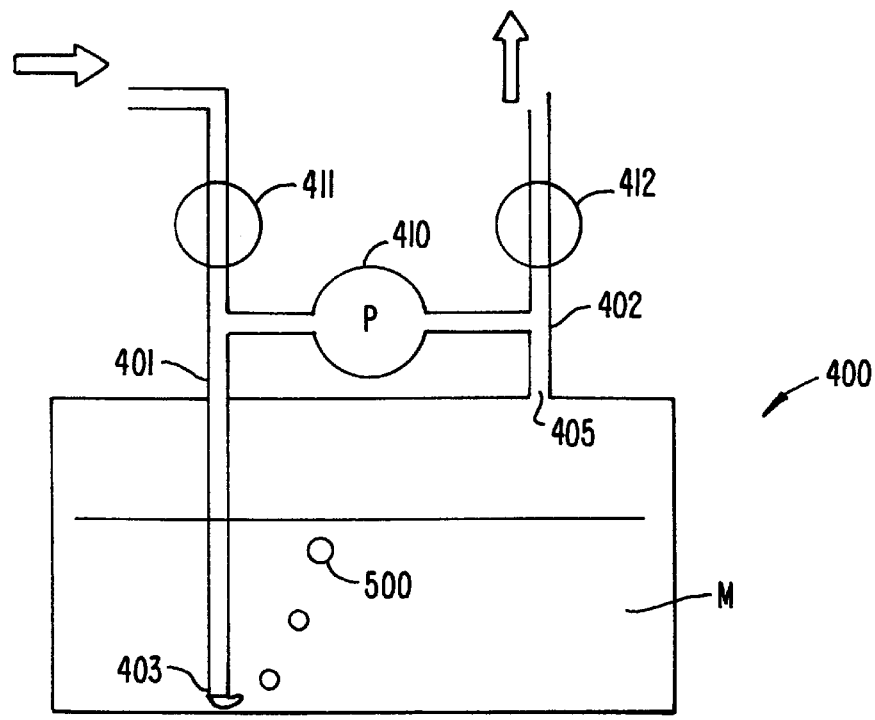
FIGS. 7–11 depict the sequence for closing and opening the gas inlet and gas outlet valves when pressure measurements are taken for the ampule.

A preferred method of the present invention is depicted in FIGS. 7–11. During the CVD process, there are periods when deposition gas is not being introduced into the chamber and this provides an opportunity to measure the amount of fluid remaining without interfering with wafer processing. The method discloses a valve closing sequence which prevents backflow of liquid into inlet pipe 401 through nozzle 403. The method takes particular advantage of the lower, preferably subatmospheric or vacuum pressure in the CVD processing chamber. It is desirable that the pressure in the chamber 15 (FIG. 1) is lower than the pressure in the ampule 400. FIG. 7 depicts an initial state of the bubbler ampule 400 while carrier gas is being introduced through inlet pipe 401. Bubbles 500 of carrier gas exit from the nozzle 403 and ascend through the liquid material M. Both of the valves 411 and 412 are open at this stage of bubbling.

Figure 8:
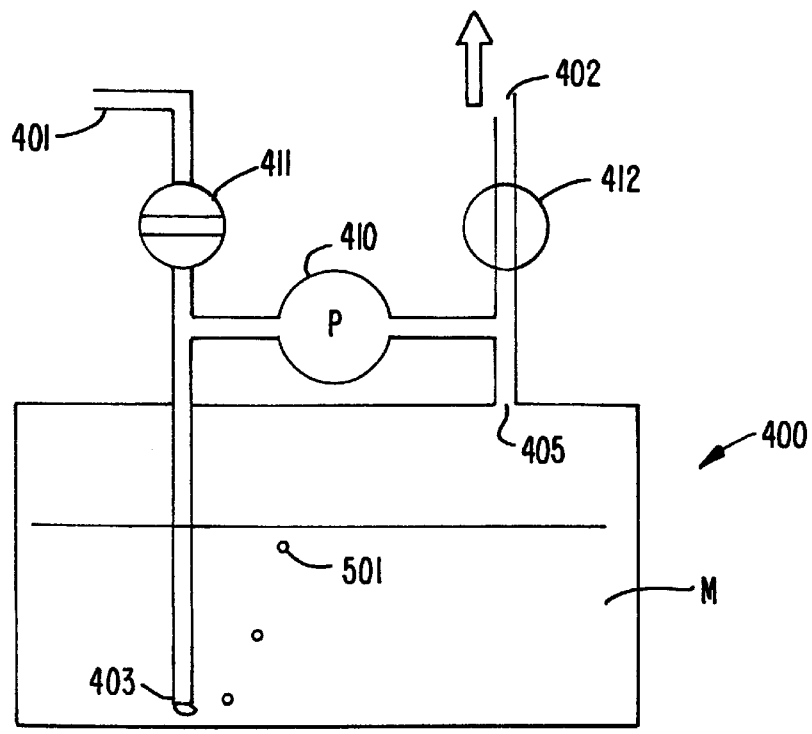

As depicted in FIG. 8, when the CVD chamber does not need any more of the carrier gas and vaporized liquid material mixture, the valve closing process begins in the bubbler ampule 400. Inlet valve 411 on the inlet pipe 401 is turned off first. The vacuum or subatmospheric pressure in the CVD chamber, or other chamber to which the ampule 400 feeds, continues to draw carrier gas from the nozzle 403 at a reduced flowrate. Preferably, the destination chamber is at a pressure below the pressure of ampule 400. Smaller bubbles 501 may evidence this reduced flowrate. The continued, reduced flow of gas from the nozzle 403 ensures that the liquid material M does not backflow into the inlet pipe 401 through nozzle 403. The vacuum also ensures that the pressure in the ampule will not be substantially higher than that in the CVD chamber when valve 412 is closed. For safety and performance reasons, it is important to prevent splashing or injection of material into the CVD reaction chamber during the gas-burst (discussed below).

Figure 9:
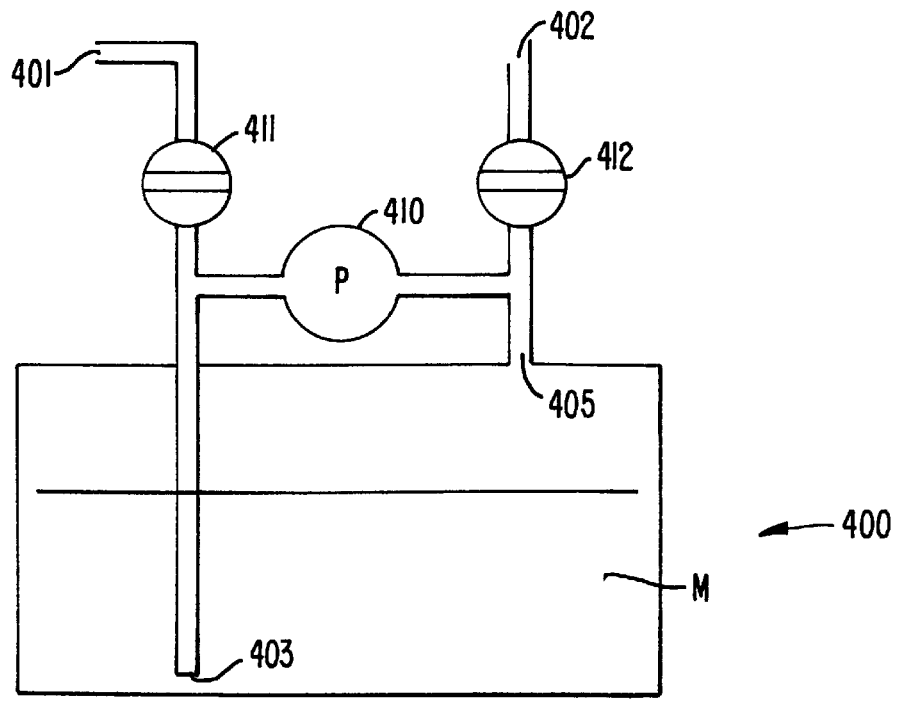

FIG. 9 depicts the bubbler ampule 400 with both valves 411 and 412 in closed conditions. In a preferred aspect, outlet valve 412 is shut off within about 0.5 seconds of the closure of inlet valve 411. Prolonged delay in shutting of outlet 412 may result in backflow of liquid into the pipe 401. Such backflow may result in inaccurate measurements of liquid level in the container. As shown in FIG. 9, the liquid within the ampule 400 at this point is at a static condition, and preferably, the pressure differential measurements are taken at this time.

Figure 10:
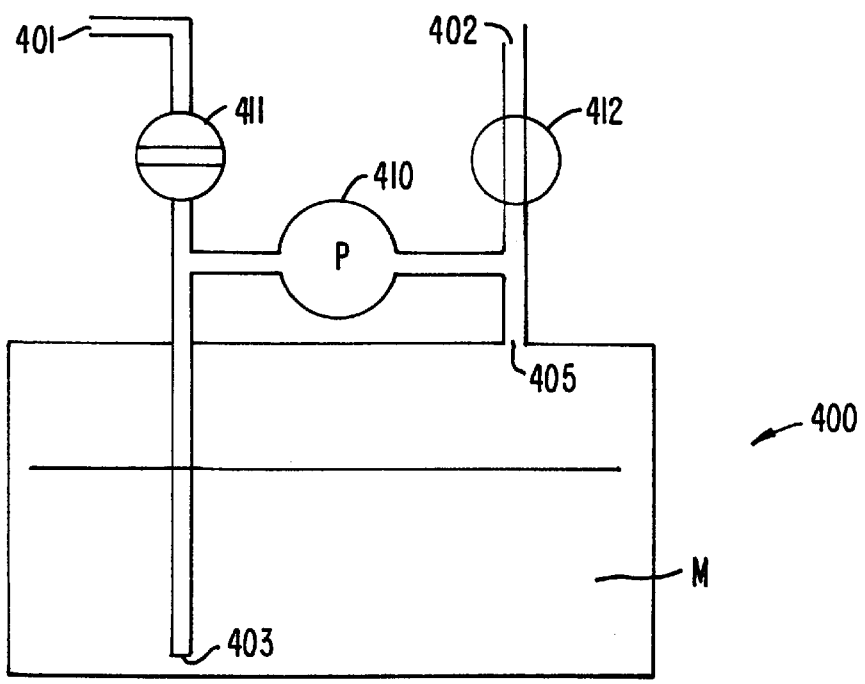

When the wafer process requires additional deposition gas to be introduced into the CVD chamber, the sequence in which the valves are opened is again important. As shown in FIG. 10, outlet valve 412 is preferably opened first. Again this prevents any high pressure buildup in the line leading to the CVD chamber which may result in splashing or pressure spike into the reactor. The ampule will act as a damper for the incoming rush of carrier gas. Inlet valve 411 remains closed during this step.

Figure 11:
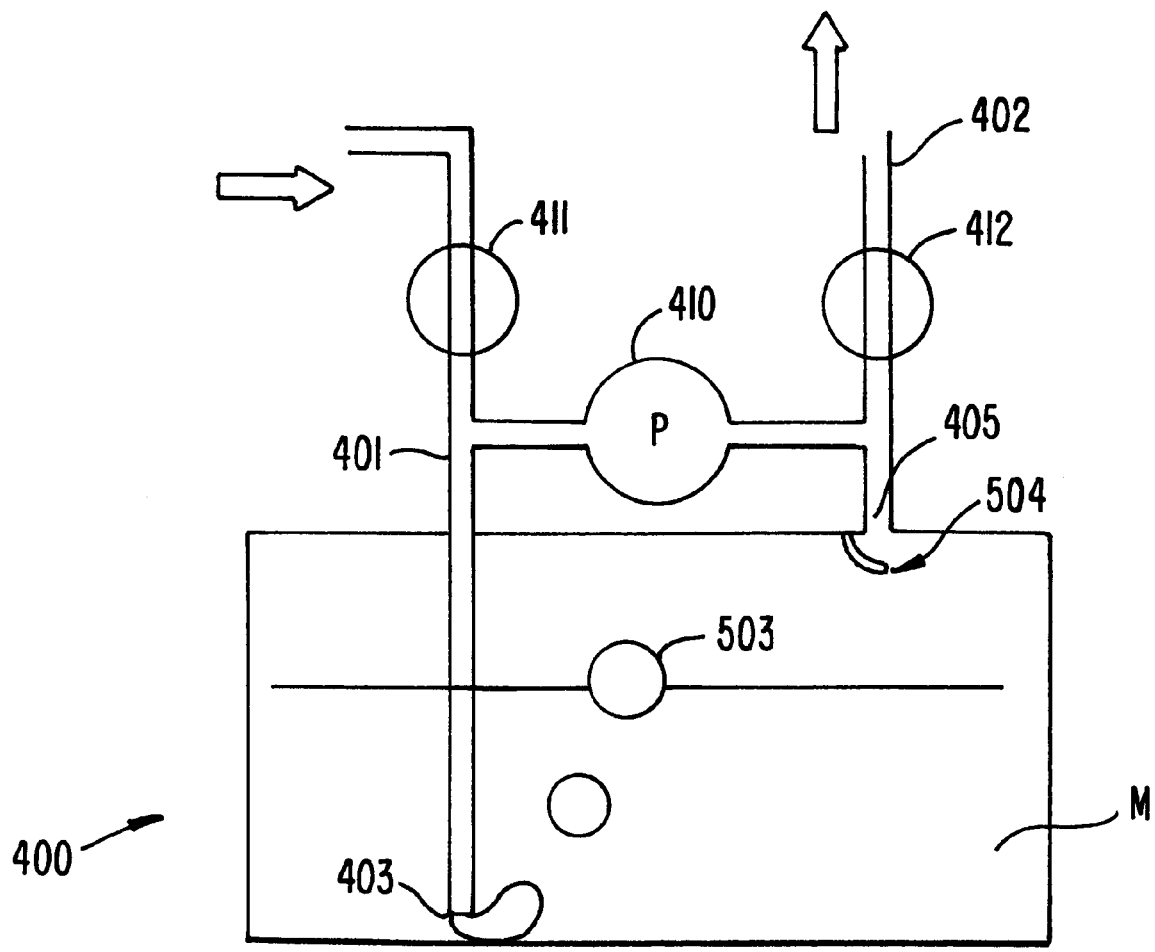

FIG. 11 depicts the opening of inlet valve 411 and the resultant gas burst as evidenced by large bubbles 503. Gas pressure continues to build upstream from valve 411 while valve 411 is shut off. For example, since the mass flow controller (MFC) which controls gas flow into the ampule is typically left on, pressure builds upstream of valve 411 to about 1035–1555 Torr. Opening the valve 411 causes a 2070 Torr pressure spike on the pressure transducer 410. When valve 411 opens, this pressure is released into a relative vacuum or low pressure area in the ampule. This results in a gas burst and splashing of the liquid material M. The material M may splash into the outlet pipe 402 through orifice 405. A splash guard 504 is preferably placed over portions of orifice 405 to prevent the splashing and suction of liquid material into the CVD chamber. The present method of sequencing the shutting of valves ensures that liquid does not backflow into the inlet pipe 401, while also ensuring that high pressure does not build in the outlet pipe 402 leading towards the CVD chamber. The known art devices are not designed to perform this type of measurement.

Although the foregoing invention has been described in detail for purposes of clarity of understanding, it will be obvious that certain modifications may be practiced within the scope of the appended claims. For example, while the description above describes a transducer that measures a pressure differential between points C and D, separate transducers may be used to measure the actual pressure at these two points. A user or computer may then arrive at the pressure differential by subtracting one actual pressure from another. Additionally, the invention would be suitable for use in a multiwafer chamber that sequentially performs individual processing steps on each of the wafers.

What is claimed is:

1. A method for determining the level of a liquid in a container comprising the steps of:

introducing a process gas through a gas inlet of the container into a liquid within the container;

flowing the process gas through a gas outlet of the container into a semiconductor processing chamber;

stopping the introduction of the process gas into the container;

determining a volume of the liquid within the container by measuring a pressure differential between the gas inlet and the gas outlet of the container when the introduction of the process gas has stopped; and resuming the introduction of the process gas.

2. A method of claim 1 wherein the process gas is flowed into a semiconductor processing chamber having a pressure lower than the pressure in the container.

3. A method of claim 2 further comprising the step of providing an inlet valve upstream of the gas inlet and an outlet valve downstream of the gas outlet.

4. A method of claim 3 wherein the stopping step comprises closing the inlet valve and allowing process gas in the container to be drawn out of the container.

5. A method of claim 4 wherein the stopping step further comprises closing the outlet valve after closing the inlet valve.

6. A method of claim 5 wherein the resuming step comprises opening the outlet valve prior to opening the inlet valve.

7. An ampule delivery system for delivering gas to a semiconductor processing chamber comprising:
- a container for housing a liquid having a volume within the container;
- a gas inlet for introducing gas into the liquid within the container;
- a gas outlet for allowing the gas to egress the container;
- an inlet valve connected to the gas inlet, the inlet valve being adjustable between a closed position and an open position;
- an outlet valve connected to the gas outlet; and
- a pressure measuring device fluidly coupled to the gas inlet downstream of the inlet valve and upstream of the liquid in the container and to the gas outlet upstream of the outlet valve and downstream of the liquid in the container.

8. An ampule delivery system for delivery gas to a semiconductor processing chamber comprising:
- a container for housing a liquid having a volume within the container;
- a gas inlet for introducing gas into the liquid within the container;
- a gas outlet for allowing the gas to egress the container;
- an inlet valve connected to the gas inlet the inlet valve being adjustable between a closed position and an open position;
- an outlet valve connected to the gas outlet; and
- a pressure measuring device fluidly coupled to the gas inlet downstream of the inlet valve and the gas outlet upstream of the outlet valve,
- wherein said pressure measuring device comprises:
  - a diaphragm; and
  - a displacement delimiter located a distance from the diaphragm.

9. A system of claim 7 wherein the pressure measuring device can measure pressure differentials less than about 0.10 Torr.

10. An ampule delivery system for delivering gas to a semiconductor processing chamber comprising:
- a container for housing a liquid having a volume within the container;
- a gas inlet for introducing gas into the liquid within the container;
- a gas outlet for allowing the gas to egress the container;
- an inlet valve connected to the gas inlet the inlet valve being adjustable between a closed position and an open position;
- an outlet valve connected to the gas outlet;
- a pressure measuring device fluidly coupled to the gas inlet downstream of the inlet valve and the gas outlet upstream of the outlet valve;
- a first connecting tube linking the pressure measuring device to the gas inlet downstream of the inlet valve; and
- a second connecting tube linking the pressure measuring device to the gas outlet upstream of the outlet valve;
- said measuring device remaining fluidly coupled to the gas inlet, the gas outlet, and the container when said inlet and outlet valves are in a closed condition.

11. A system of claim 10 further comprising:
- a first valve on the first connecting tube; and
- a second valve on the second connecting tube.

12. An ampule delivery system for delivering gas to a semiconductor processing chamber comprising:
- a container for housing a liquid having a volume within the container;
- a gas inlet for introducing gas into the liquid within the container;
- a gas outlet for allowing the gas to egress the container;
- an inlet valve connected to the gas inlet, the inlet valve being adjustable between a closed position and an open position;
- an outlet valve connected to the gas outlet; and
- a pressure measuring device fluidly coupled to the gas inlet downstream of the inlet valve and the gas outlet upstream of the outlet valve,
- wherein the gas inlet is in the range of about 0.3 to 0.5 cm from the bottom of the container.

13. An ampule delivery system for delivering gas to a semiconductor processing chamber comprising:
- a container for housing a liquid having a volume within the container;
- a gas inlet for introducing gas into the liquid within the container;
- a gas outlet for allowing the gas to egress the container;
- an inlet valve connected to the gas inlet the inlet valve being adjustable between a closed position and an open position;
- an outlet valve connected to the gas outlet; and
- a pressure measuring device fluidly coupled to the gas inlet downstream of the inlet valve and the gas outlet upstream of the outlet valve,
- wherein the container is adapted for housing dimethylaluminum hydride (DMAH).

14. A system of claim 8 wherein the displacement delimiter is configured to prevent overextension of the diaphragm and allow the pressure measuring device to withstand a sudden pressure increase or spike from about 1 Torr to about 2070 Torr when gas is reintroduced into the chamber.

15. A system of claim 11 wherein the first valve and second valve fluidly separate the pressure measuring device from the gas inlet and gas outlet when the first and second valves are in a closed condition.

16. An ampule delivery system for delivering gas to a semiconductor processing chamber comprising:
- a container for housing a liquid having a volume within the container;
- a gas inlet for introducing gas into the liquid within the container;
- a gas outlet for allowing the gas to egress the container;
- an inlet valve connected to the gas inlet the inlet valve being adjustable between a closed position and an open position;
- an outlet valve connected to the gas outlet;
- a pressure measuring device fluidly coupled to the gas inlet downstream of the inlet valve and the gas outlet upstream of the outlet valve; and
- a splash guard disposed near the gas outlet for partially blocking the gas outlet from the liquid within the container.

17. An ampule delivery system for delivering gas to a semiconductor processing chamber, the ampule delivery system comprising:

a container;

a gas inlet line extending into the container and including a gas inlet opening for introducing gas into a liquid within the container, the gas inlet line including an inlet valve disposed upstream of the gas inlet opening, the inlet valve being adjustable between a closed position and an open position;

a gas outlet line having a gas outlet opening coupled with the container for allowing the gas to egress the container; and a pressure measuring device fluidly coupled to the gas inlet line at a location between the gas inlet opening and the inlet valve and upstream of the liquid in the container, the pressure measuring device fluidly coupled to the gas outlet line at a location between the gas outlet opening and the outlet valve and downstream of the liquid in the container.

18. An ampule delivery system for delivering gas to a semiconductor processing chamber, the ampule delivery system comprising:

a container;

a gas inlet line extending into the container and including a gas inlet opening for introducing gas into a liquid within the container, the gas inlet line including an inlet valve disposed upstream of the gas inlet opening, the inlet valve being adjustable between a closed position and an open position;

a gas outlet line having a gas outlet opening coupled with the container for allowing the gas to egress the container;

a pressure measuring device fluidly coupled to the gas inlet line at a location between the gas inlet opening and the inlet valve, the pressure measuring device fluidly coupled to the gas outlet line at a location between the gas outlet opening and the outlet valve; and a first connecting line connecting the pressure measuring device to the gas inlet line at the location between the gas inlet opening and the inlet valve; and a second connecting line connecting the pressure measuring device to the gas outlet line at the location between the gas outlet opening and the outlet valve.

19. A system of claim 18 wherein the first connecting line includes a first valve adjustable between an open position ad a closed position.

20. A system of claim 19 wherein the second connecting line includes a second valve adjustable between an open position and a closed position.

* * * * *